(12) United States Patent  
Kiep

(10) Patent No.: US 7,005,882 B2
(45) Date of Patent: Feb. 28, 2006

(54) METHOD AND APPARATUS FOR DETERMINING THE SWITCHING STATE OF A TRANSISTOR

(75) Inventor: Andreas Kiep, Munich (DE)

(73) Assignee: Infineon Technologies AG, Munich (DE)

( * ) Notice: Subject to any disclaimer, the term of this patent is extended or adjusted under 35 U.S.C. 154(b) by 45 days.

(21) Appl. No.: 10/819,618

(22) Filed: Apr. 7, 2004

(65) Prior Publication Data
US 2004/0263201 A1   Dec. 30, 2004

(30) Foreign Application Priority Data
Apr. 9, 2003  (DE) ............................. 103 16 223

(51) Int. Cl.
*G01R 31/26* (2006.01)

(52) U.S. Cl. .................... 324/769; 324/158.1
(58) Field of Classification Search ........... 324/769; 327/109
See application file for complete search history.

(56) References Cited

U.S. PATENT DOCUMENTS

| 5,099,138 | A |   | 3/1992  | Fukunaga |
| 5,537,054 | A | * | 7/1996  | Suzuki et al. ............... 324/770 |
| 5,783,998 | A | * | 7/1998  | Nakajou et al. ....... 340/636.15 |
| 5,872,460 | A | * | 2/1999  | Bennett et al. ............. 324/769 |
| 5,959,464 | A | * | 9/1999  | Qualich ...................... 324/769 |
| 6,664,801 | B1 | * | 12/2003 | Palusa ........................ 324/765 |
| 6,756,806 | B1 | * | 6/2004  | Yang et al. ................. 324/769 |

* cited by examiner

*Primary Examiner*—Vinh P. Nguyen
(74) *Attorney, Agent, or Firm*—Dicke, Billig & Czaja, PLLC

(57) ABSTRACT

A method for determining the switching state of a transistor having an insulated drive electrode. The drive electrode is charged during a switch-on cycle depending on a drive signal and is discharged during a switch-off cycle depending on the drive signal. The transistor turns on or turns off depending on the charge stored on the drive electrode. The temporal profile of a charging and discharging current of the drive electrode or the temporal profile of the charge stored on the drive electrode is evaluated in order to determine the switching state. A state signal dependent on the switching state is provided, as is an apparatus for carrying out this method.

10 Claims, 9 Drawing Sheets

METHOD AND APPARATUS FOR DETERMINING THE SWITCHING STATE OF A TRANSISTOR

CROSS-REFERENCE TO RELATED APPLICATIONS

This Utility Patent Application claims priority to German Patent Application No. DE 103 16 223.2, filed on Apr. 9, 2003, which is incorporated herein by reference.

BACKGROUND

The present invention relates to a method and an apparatus for determining the switching state of a transistor having an insulated control electrode, such as, by way of example, a MOSFET or IGBT.

Transistors of this type, which are also referred to as voltage-controlled transistors, turn on and turn off depending on a control voltage present between the drive terminal, the gate terminal in the case of a MOSFET and an IGBT, and one of the load path terminals, the source terminal in the case of a MOSFET and the emitter terminal in the case of an IGBT. When such a drive voltage is applied to the terminal of an initially turned-off transistor, said terminals being externally accessible at a transistor housing, a charging current flows onto the gate electrode in order to charge the latter. In this case, what is important for the switching state of the transistor is the charge that has flowed onto the gate electrode or the internal drive voltage resulting from said charge that has flowed onto the drive electrode, which differs from the externally applied drive voltage owing to parasitic resistances in the lead of the drive electrode and during the switch-on operation owing to the action of the drive electrode as a capacitor. This internal drive voltage can only be tapped off directly at the transistor chip packaged in a housing and is therefore not available for measurements.

Such transistors having an insulated electrode are used in particular as power switches which are constructed in a cellular manner and in which a multiplicity of identically constructed transistors are connected in parallel in order to achieve a high current-carrying capacity and dielectric strength. The data sheets of such components reveal the externally applied gate voltages at which such power switches are switched on, the gate voltages at which they are switched off or the gate voltages at which they are in the transition region between the on state and off state. Precise acquisition of the switch-on and switch-off instants of such power switches is necessary in the case of half-bridges, for example, in which the load paths of two semiconductor power switches are connected in series between two supply potentials and to the common load terminal of which a load is connected. In order to avoid switching losses and in particular in order to avoid a short circuit, it is necessary, in the case of such applications, to ensure that only one of the two power switches in each case turns on. In order to optimize the time sequence of the driving of the two semiconductor power switches, it is necessary to exactly determine in particular the switch-off instants of the power switches in order that one of the power switches is switched on only when the respective other power switch reliable turns off.

In order to determine the switching state of a power switch or in order to determine the switching instants, it is known to use the respective drive signal according to which the drive electrode of the power switch is charged and discharged via a driver circuit. For example, it is known, after a level change in said drive signal, to wait for a fixed time duration until a change in the switching state is indicated by means of a suitable state signal. This waiting time is dimensioned so generously that after the waiting time has elapsed, the power switch reliably turns on or reliably turns off. What is disadvantageous in this case is that the actual instant at which the switching operation is concluded is not determined. Moreover, the generous dimensioning of the waiting time contributes to switching losses.

Furthermore, it is possible to derive the switching state from the externally applied drive voltage. What is disadvantageous in this case is that the internal drive voltage which determines the switching state temporally lags behind said externally applied drive voltage, so that this method is not exact enough to determine the precise instant of switching on and/or switching off. Moreover, the internal drive voltage cannot be determined unambiguously on the basis of the drive voltage applied externally to the component, owing to parasitic effects of the connecting lines and the housing. Furthermore, when evaluating the gate-source voltage in the case of a MOSFET, there is the difficulty that, owing to the known Miller effect, when a drive voltage is applied, the gate-source voltage first of all rises, then remains approximately at a constant level for a specific time duration, before rising further. The switch-on operation takes place during this time period during which the gate-source voltage remains at the constant level, the so-called Miller plateau, so that there is the difficulty of comparing said gate-source voltage with a reference value which lies as little as possible above the plateau for the purpose of determining the switch-on instant, and with a reference value which lies as little as possible below the plateau for the purpose of determining the switch-off state.

The switching state of a power switch can also be determined on the basis of the load path voltage present across the power switch. However, the voltages switched by power switches often lie in the range of from a few tens to a few hundreds of volts. Such voltages cannot be evaluated by means of conventional logic circuits, so that corresponding voltage dividers are necessary, which in turn increase the evaluation costs.

SUMMARY

One embodiment of the present invention provides a method and an apparatus for determining the switching state of a transistor having an insulated drive electrode to ensure an exact and cost-effective acquisition of the switching state.

The method according to one embodiment of the invention for determining the switching state of a transistor having an insulated drive electrode provides for evaluating the temporal profile of a charging and discharging current of the drive electrode or the temporal profile of the charge stored on the drive electrode, a state signal that specifies the switching state being provided.

In contrast to known methods, in the case of the method according to one embodiment of the invention, the variable that determines the switching state, namely the charge stored on the drive electrode, is evaluated directly, it being possible to determine said charge on the basis of the charging and discharging current flowing on the drive electrode over time. The method according to one embodiment of the invention is particularly effective because the charging current, both for on-state driving of the transistor and for off-state driving of the transistor, flows through a driver circuit that usually provides the charging and discharging currents, so that the charge stored on the drive electrode can be acquired in a simple manner in the driver circuit by means of said charging current. Using a signal dependent on the charge stored on the drive electrode for determining the switching state results in the fact that the charge stored on the drive electrode oscillates to a lesser extent than, by way of example, the load path voltage or the drive voltage, and is capable of being tapped off of the transistor, externally.

One embodiment of the method according to the invention provides for a current measurement signal dependent on the charging and discharging current to be made available, for the current measurement signal to be integrated over time in order to provide a charge signal and for the charge signal to be compared with a reference signal, the state signal that represents the switching state being provided depending on this comparison result.

In one embodiment, different reference signals are selected for the switch-on operation and the switch-off operation of the transistor, the reference signal for the switch-on operation being chosen such that the transistor reliably turns on if the charge signal reaches the reference signal, and the reference signal for the switch-off operation being chosen such that the transistor reliably turns off if the charge signal reaches the reference signal. The reference signal or reference signals are externally adjustable at an evaluation unit that provides the state signal.

In one embodiment, during a switch-on cycle, during which a charging current flows onto the control electrode, a maximum value of the charge signal is determined, and the reference signal or the reference signals, if different reference signals are used for the switch-on operation and switch-off operation, are set depending on said maximum value. This makes it possible to provide a state signal that has a level change in the event of switch-on when the charge stored on the drive electrode corresponds to a predetermined proportion of the overall charge, and in the case of which the state signal has a level change in the event of switch-off when the charge stored on the drive electrode only corresponds to a predetermined proportion of the overall charge.

A further embodiment of the method provides for determining, during a drive cycle of the transistor, a first time duration between a first instant, at which a first quantity of charge is stored on the drive electrode, and a second instant, at which a second quantity of charge is stored on the drive electrode. Said time duration may be used during a subsequent drive cycle to determine the state signal by determining the instant at which the first charge is stored on the drive electrode and, proceeding from this instant, waiting for a time duration dependent on the time duration determined until a level change of the state signal is generated and a change in the switching state is thus indicated.

Furthermore, it is possible to determine the time duration between a first instant, at which a first quantity of charge is stored on the drive electrode, and a second instant, at which a second quantity of charge is stored on the drive electrode, and to compare it with a reference time duration. These instants are determined, for example, by comparing the value of the charge stored on the drive electrode with a first and second reference value, the first and second instants corresponding to the instants at which the stored charge corresponds to the reference values. Depending on the comparison result, during a next drive cycle, the first reference value is increased or decreased and the value of the first time duration is determined anew. This operation is repeated during subsequent drive cycles until a first reference value is set which is assigned to a first time duration which corresponds to the reference time duration or deviates from the reference time duration by less than a predetermined value.

The second quantity of charge or the second reference value is chosen, for example, such that the transistor reliably turns off if the gate electrode has been discharged down to the value of the second quantity of charge during a switch-off cycle. If the transistor is used in a circuit in which further circuit components are driven depending on the switch-off state of the transistor being reached and if, in the driving of the further circuit components, it is necessary to take account of delay times, for example due to gate transit times, then the reference time duration is advantageously chosen to be equal to this delay time. If, in the case of this embodiment of the method, the first reference value is established such that the first time duration between reaching the first reference charge on the drive electrode and the second reference charge on the drive electrode corresponds to the delay time, then it is possible, during subsequent drive cycles, to generate an edge of the state signal that indicates a change in the switching state upon reaching the first reference charge, in order to drive a driving of the other circuit components. Owing to the delay time, the latter are actually driven only when the charge on the drive electrode has fallen to the second reference value, at which the transistor reliably turns off.

A further embodiment of the method according to the invention provides for the current measurement signal dependent on the charging and discharging current to be evaluated directly, in particular, with respect to when a second peak of the current measurement signal is reached, in order to generate the state signal in a manner dependent thereon. This type of evaluation is suitable for identifying the switching state of a power switch that is used as a high-side switch, that is to say which is connected between a positive supply potential and the load, said switch serving to drive an inductive load. When such a high-side switch turns off, the charge of the drive electrode is dissipated in two phases, thus resulting in a two-stage discharge operation. For determining the switching state, use is made in this case of the insight that the transistor is reliably turned off at the instant at which the second peak of the discharging current is reached. In order to evaluate this temporal profile, the current measurement signal is compared for example with a reference signal, a level change in a comparison signal that results from this comparison being counted by means of a counting arrangement and the state signal being generated in such a way that it has a level change at the instant at which the comparison signal changes the level for a second time.

The apparatus for determining the switching state of a transistor having an insulated drive electrode comprises a current measuring arrangement, which provides a current measurement signal dependent on a charging and discharging current of the transistor, and also an evaluation unit, to which the current measurement signal is fed and which provides a state signal dependent on the temporal profile of the current measurement signal.

In one embodiment, the evaluation unit comprises an integrating unit, to which the current measurement signal is fed and which provides a charge signal dependent on the charge stored on the drive electrode. The charge signal and a first reference signal are fed to a comparator unit, the comparator unit providing a state signal dependent on a comparison of the charge signal and the first reference signal.

The evaluation unit preferably comprises a maximum value acquisition unit, to which the charge signal is fed and which provides a maximum value signal, the first reference signal being dependent on the maximum value signal.

In another embodiment, the evaluation unit comprises an integrating unit, to which the current measurement signal is fed and which provides a charge signal dependent on the electrical charge stored on the drive electrode. The evaluation unit furthermore comprises a first comparison unit, to which the charge signal or a first reference signal are fed and which provides a first comparison signal, and also a second comparator unit, to which the charge signal and a second reference signal are fed and which provides a second comparison signal. The first and second comparison signals are fed to a time acquisition unit, which provides a time signal dependent on a temporal distance between a level change of the first comparison signal and a level change of the second comparison signal. Said time signal and the first comparison signal are fed to a combination unit, which provides the state signal depending on the first comparison signal and the time signal.

In one embodiment, the second comparison signal is also fed to the combination unit, the combination unit being designed to output the second comparison signal as state signal, if the time signal is less than a predetermined value. This makes it possible for the evaluation circuit also to function in the first drive cycle when a time duration between level changes of the first and second comparison signals has not yet been determined.

In a further embodiment, the evaluation unit comprises a comparator unit, to which the current measurement signal and a third reference signal are fed and which provides a comparison signal. Connected downstream of the comparator unit is a counter arrangement, which is designed to count level changes of the comparison signal and which provides a counting signal dependent on the counter reading. Connected downstream of the counter arrangement is a counter signal evaluation unit, to which the counter signal is fed and which provides a status signal dependent on the counter signal. The counter arrangement is designed to assume a first and a second counter reading on which the counter signal is dependent, the counter evaluation unit providing a state signal, which has a level change if the counter reading changes from one specific counter reading of the two counter readings to the other counter reading. In other words, a level change of the state signal is generated whenever two level changes of the comparison signal have been determined.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
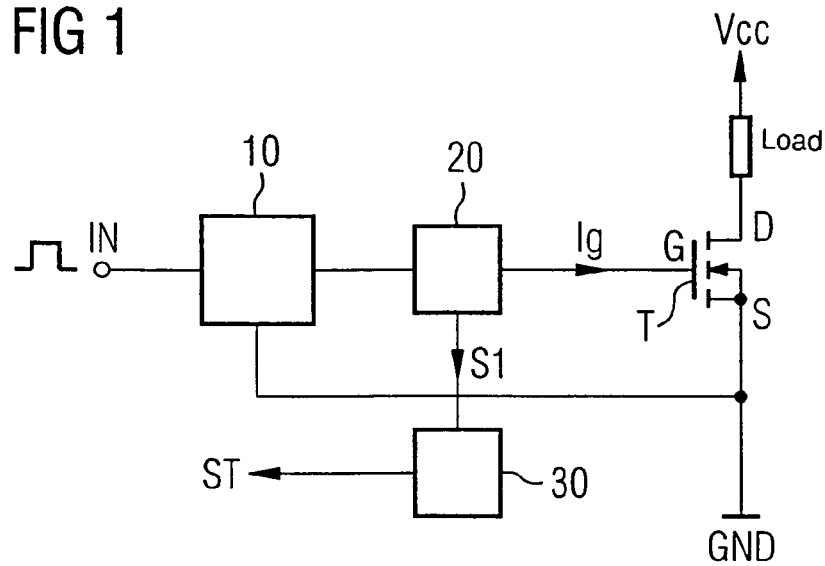
FIG. 1 illustrates a circuit arrangement with a MOSFET used as a low-side switch and with a drive circuit, the drive circuit having a circuit arrangement for acquiring the switching state of the MOSFET.

FIG. 1 illustrates a circuit arrangement with a MOSFET used as a low-side switch, the drain-source path D-S of which is connected in series with a load between a supply potential Vcc and reference-ground potential GND. The MOSFET T is driven according to a drive signal IN via a driver circuit 10, the driver circuit 10 serving to convert the control signal IN, which is a signal having a logic level, for example, into a signal having suitable levels for driving the MOSFET T. For on-state driving, a gate charging current Ig flows onto the gate electrode G, which serves as the drive electrode of the MOSFET T. In order to turn off the MOSFET T, a discharging current flows from the gate electrode, or a negative charging current Ig.

Figure 3A:
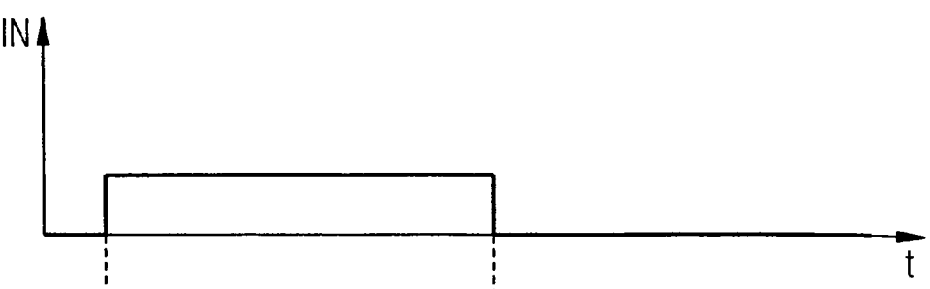
FIGS. 3A–3D illustrate exemplary time profiles of selected signals illustrated in FIGS. 1 and 2.
Figure 3B:
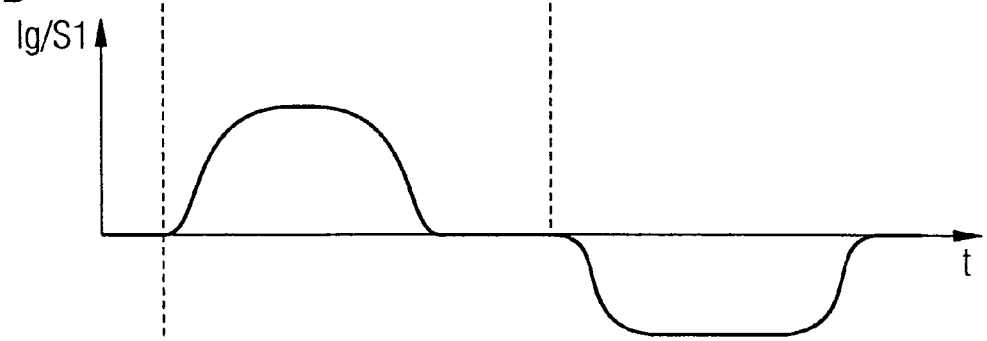

FIGS. 3A and 3B illustrate, by way of example, a temporal profile of the drive signal IN and the temporal profile of the gate charging current Ig depending on the drive signal IN. The illustration presupposes that the drive signal IN assumes a high level if the MOSFET T is intended to be driven in the on state. For on-state driving, a positive charging current Ig flows onto the gate electrode, which current is brought about by the fact that the driver circuit 10 applies a positive drive voltage between the gate terminal G and the source terminal S of the MOSFET. Correspondingly, the drive signal IN assumes a low level if the MOSFET is intended to be turned off, a negative gate charging current Ig or a discharging current then flowing. Said discharging current is brought about for example by the fact that the driver circuit 10 short-circuits the gate terminal G and the source terminal S of the MOSFET T.

A circuit arrangement for determining the switching state of the MOSFET T and for providing a state signal ST dependent on the switching state comprises a current acquisition unit 20, which is connected to the gate terminal G of the MOSFET and which is connected between the driver circuit 10 and the gate terminal G. The current acquisition unit 20 provides a current measurement signal S1 dependent on the gate charging current Ig, which signal is fed to an evaluation unit 30. The evaluation unit 30 evaluates the temporal profile of the current measurement signal S1 and provides the state signal ST depending on said temporal profile.

Figure 2A:
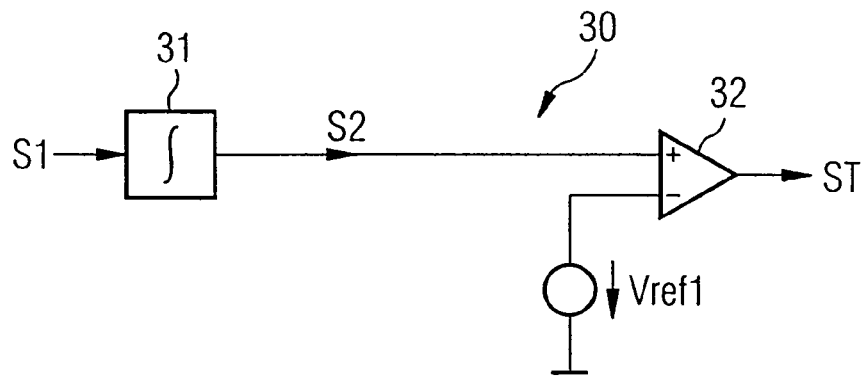
FIG. 2A illustrates an exemplary embodiment of an evaluation unit for determining a state signal dependent on a switching state using one reference signal.

FIG. 2A illustrates an exemplary embodiment of such an evaluation unit 30 which provides the state signal ST from the current measurement signal S1. This evaluation unit 30 comprises an integrating unit 31, to which the current measurement signal S1 is fed and which provides a charge signal S2, which corresponds to the integral of the current measurement signal S1 over time and which is thus proportional to the electrical charge of the MOSFET T stored on the gate electrode G.

Figure 3C:
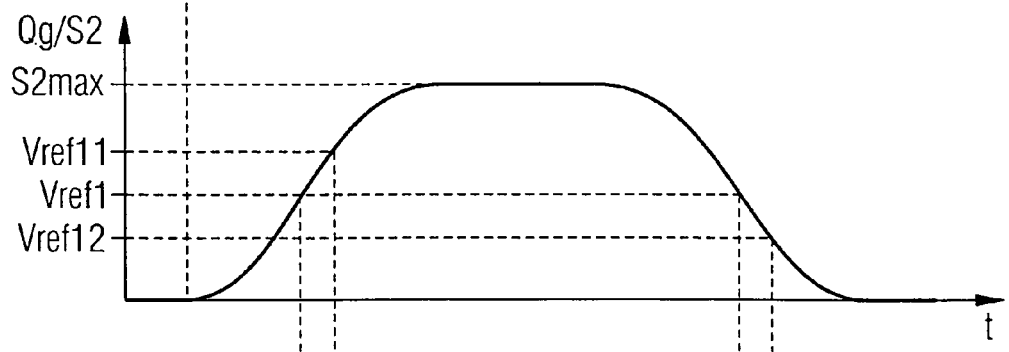
Figure 3D:
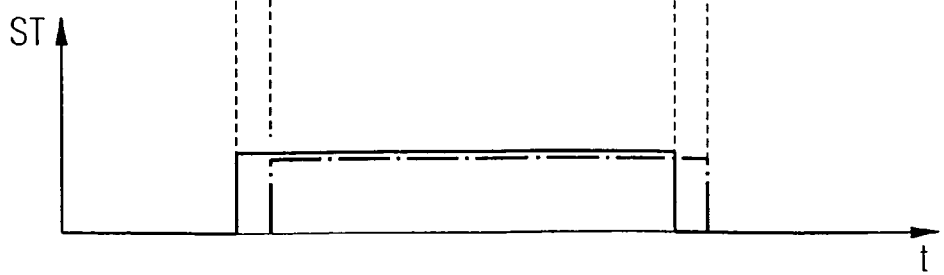

FIG. 3C illustrates, by way of example, the temporal profile of said charge signal S2 or the charge Qg stored on the gate electrode G over time. Said charge Qg or the charge signal S2 reaches a maximum value S2max after the conclusion of the charging operation, when the charging current Ig has fallen to zero and the internal gate-source voltage of the MOSFET approximately corresponds to the voltage—applied externally by the driver circuit 10—between the gate terminal G and the source terminal S.

The evaluation unit 30 in accordance with FIG. 2 furthermore comprises a comparator unit 32, to which the charge signal S2 and a first reference signal Vref1, provided by a reference voltage source, are fed. The state signal ST is available at the output of the comparator arrangement 32, FIG. 3C illustrating the temporal profile of said state signal depending on the charge signal S2 illustrated in FIG. 3B and the reference signal Vref1 likewise depicted in FIG. 3B. In one exemplary embodiment, the state signal ST is chosen such that it assumes a high level if the charge signal S2 exceeds the reference value Vref1, and that it assumes a low level if the charge signal S2 falls below the value of the reference signal Vref1.

For many applications, it is important to acquire the instant at which the MOSFET is switched off, this instant being identified by the falling edge of the state signal ST in FIG. 3C. In one embodiment, the reference signal Vref1 is chosen relative to the charge signal S2 or the gate charge Qg such that the MOSFET is reliably turned off if the charge signal S2 has fallen down to the value of the reference signal Vref1.

Figure 2B:
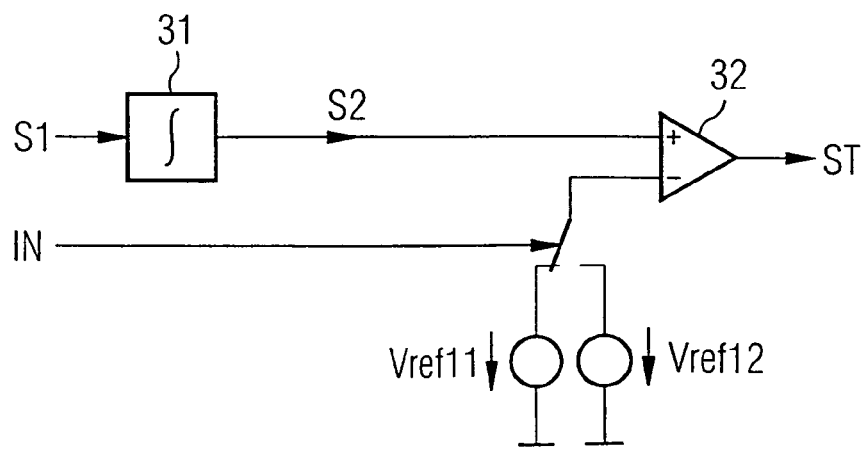
FIG. 2B illustrates an exemplary embodiment of an evaluation unit for determining a state signal dependent on a switching state using two reference signals.

In order to acquire instants at which the MOSFET reliably turns on and reliably turns off, different reference values are provided for the detection of the switch-on state and the detection of the switch-off state. FIG. 2B illustrates a circuit that is modified for this purpose and has two reference voltage sources which respectively provide a first and a second reference voltage Vref11, Vref12. Furthermore, a switch SW is provided, which, depending on the drive signal IN, connects one of the two reference voltage sources to the inverting input of the comparator arrangement 32, designed as a comparator, so that, during a switch-on operation during which the drive signal IN has a high level, the first reference signal Vref11 is compared with the charge signal S2 for the purpose of generating the state signal ST, and that, during a switch-off operation when the drive signal IN has a low level, the second reference signal Vref12 is compared with the charge signal S2 for the purpose of generating the state signal ST. The levels of said first and second reference signals Vref11 and Vref12 are depicted in a dash-dotted manner in FIG. 3B. Correspondingly, the resultant state signal ST is likewise depicted in a dash-dotted manner in FIG. 3C. As emerges from FIG. 3B, the levels of the first and second reference signals Vref11, Vref12 differ, the first reference signal Vref11, which, together with the charge signal S2, specifies the switch-on instant, being greater than the second reference signal Vref12 which, together with the charge signal S2, specifies the switch-off instant.

In one embodiment, the reference value Vref1 or the reference values Vref11, Vref12 are in a fixed ratio to a maximum value S2max of the charge signal S2, said maximum value S2max being proportional to the maximum gate charge of the MOSFET T. This procedure makes it possible to take account of production-dictated fluctuations in the gate-source capacitance and the maximum gate charge resulting therefrom, since a switch-on state or switch-off state is assumed to be reached when the charge signal S2 reaches a reference value which is in a fixed ratio to the maximum charge signal S2max. The reference signal Vref, with which the charge signal S2 is compared for detection of the switch-off instant, is preferably chosen such that it is between 15% and 25% of the maximum charge signal S2max. Moreover, in this case it is possible to use the evaluation unit for different transistors with different gate-source capacitances which have the common feature that they turn on or turn off upon reaching a predetermined proportion of the maximum charge.

Figure 4:
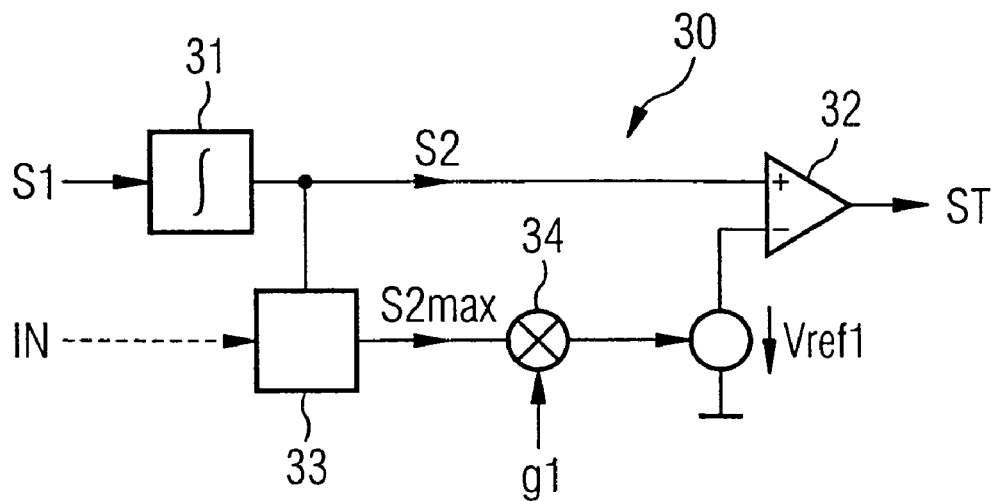
FIG. 4 illustrates a further exemplary embodiment of an evaluation unit for providing a state signal dependent on a switching state.

FIG. 4 illustrates an evaluation unit 30, in which a reference signal Vref1 is provided, which is in a fixed ratio to the maximum charge signal S2max. For this purpose, the evaluation unit 30 comprises a maximum value acquisition unit 33, which evaluates the charge signal S2 for a predetermined time duration and provides the maximum value determined during this time duration at an output. In one embodiment, the evaluation interval within which the maximum value acquisition unit 33 evaluates the charge signal S2 is prescribed by the drive signal IN, the time duration of the evaluation interval corresponding to the time duration during which the drive signal IN has a high level. The maximum value S2max determined by the maximum value acquisition unit 33 is fed to a weighting unit 34, which weights this maximum signal with a weighting factor g1, the output signal of said weighting unit 34 serving for setting the value of the reference signal Vref1. The value of the reference signal Vref1 corresponds to the product of the weighting factor g1 and the maximum value S2max, that is to say: Vref1=S2max·g1.

The acquisition of the maximum value S2max requires that a complete switch-on cycle is run through, the maximum value S2max not yet being available for setting the reference signal Vref1 during said switch-on cycle. Therefore, the reference voltage source is formed such that it provides a preset reference value Vref1 when, as for example during the first drive cycle, a setting signal is not yet available at the output of the weighting unit 34. For the detection of the switch-off state, said reference value is zero, for example, so that during a drive cycle during which no setting signal is available, the falling edge of the state signal ST indicates a switch-off state only when the charge signal S2 has fallen to zero and the drive electrode is thus completely discharged. A resultant time delay between the switch-off state actually being reached and the falling edge of the state signal is tolerable for safety reasons during those first drive cycles during which a setting signal is not yet available.

The circuit arrangement in accordance with FIG. 4 may, of course, be modified according to the circuit arrangement in accordance with FIG. 2B in order to provide different reference signals for the switch-on operation and the switch-off operation, a first reference signal being formed by the maximum signal S2max being weighted with a first weighting factor, for example the weighting factor g1, and a second reference signal being formed by the maximum signal S2max being weighted with a second weighting factor, a changeover being made between the two reference voltage sources that provide the reference signals in accordance with the illustration in FIG. 2B by means of a switch according to the drive signal IN.

Figure 5:
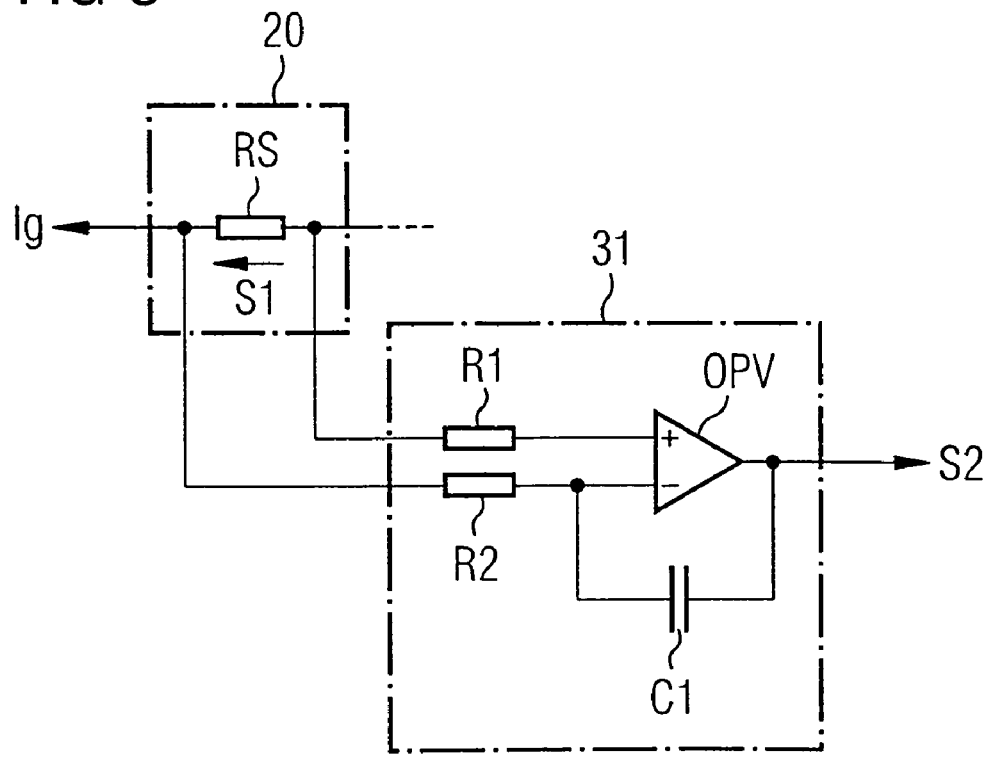
FIG. 5 illustrates an exemplary circuitry realization of an integrating unit for use in one of the evaluation units.
Figure 11:
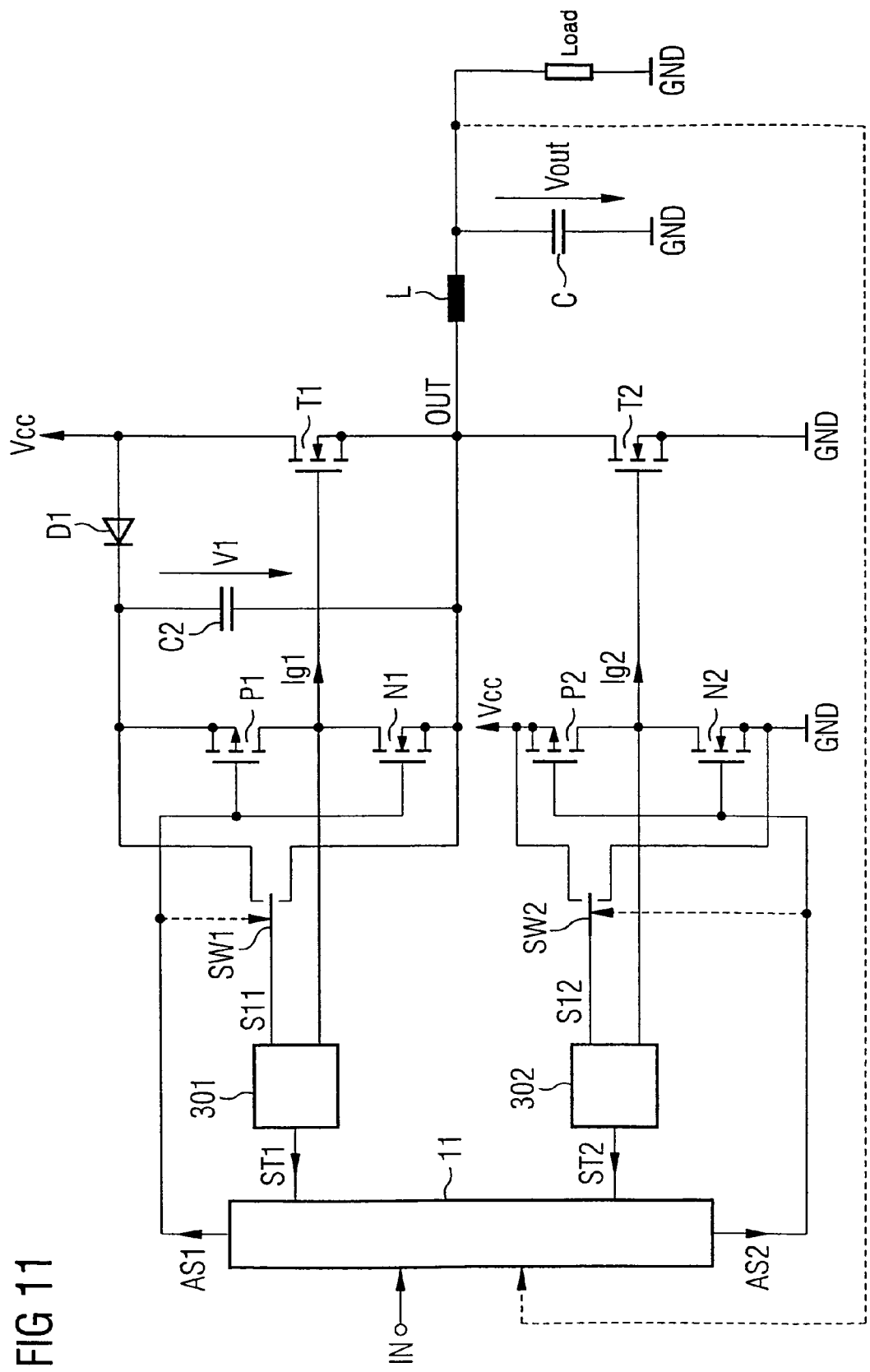
FIG. 11 illustrates a half-bridge circuit with two series-connected MOSFETs and an evaluation unit for determining switching states of the MOSFETs.

FIG. 5 illustrates an exemplary circuitry realization of the current acquisition unit 20 and of the integrating unit 31, which is connected downstream of the current acquisition unit 20 and provides the charge signal S2. In the exemplary embodiment, the current acquisition unit 20 is formed as a current acquisition resistor Rs, which is connected upstream of the gate terminal G of the MOSFET and through which the gate charging current Ig flows. Referring to FIG. 11, the current measuring resistor Rs may be, in particular, the load path resistance of a semiconductor switch which serves to connect the gate electrode to a supply potential for driving purposes or to short-circuit gate and source. In one exemplary embodiment, the current measurement signal S1 corresponds to the voltage drop across the current acquisition resistor Rs which is brought about by said charging current Ig. The integrating unit 31 comprises an operational amplifier OPV, resistors R1, R2 being connected upstream of the inputs of said operational amplifier, the voltage S1 present across the current acquisition resistor Rs being fed to the operational amplifier OPV via said inputs. The inverting input of the operational amplifier OPV is connected to the output of the operational amplifier OPV by means of a capacitor C1 in a sufficiently known manner. The charge signal S2, corresponding to the integral of the current measurement signal S1 over time, is available at the output of the operational amplifier OPV.

Figure 6:
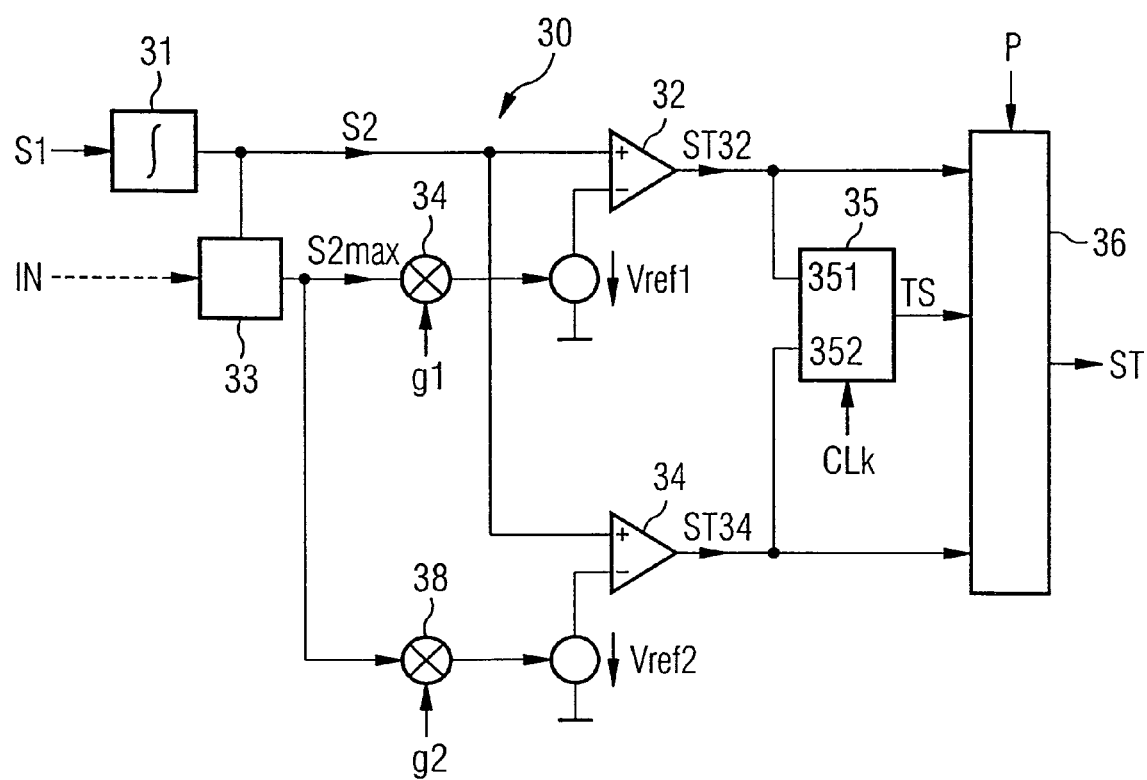
FIG. 6 illustrates a further exemplary embodiment of an evaluation unit for determining a state signal dependent on a switching state of the transistor.

FIG. 6 illustrates a further exemplary embodiment of an evaluation unit 30 for providing a state signal ST dependent on the switching state of the MOSFET. The evaluation unit 30 comprises a second comparator unit 34 in addition to the integrating unit 31, the maximum value acquisition unit 33, the weighting unit 34 and the comparator unit 32. The first comparator unit 32 compares the charge signal S2 with a first reference value Vref1, which is in a fixed ratio to the maximum value S2max by means of the weighting factor g1 in the manner already explained. The second comparator unit 34 compares the charge signal S2 with a second reference signal Vref2, which is in a fixed ratio to the maximum value signal S2max of the charge signal S2 by means of a weighting factor g2. A first comparison signal ST32 is available at the output of the first comparator unit 32 and a second comparison signal ST34 is available at the output of the second comparator unit 34, which signals are fed to a first and a second input 351, 352 of a time acquisition unit 35. The time acquisition unit 35 is designed to acquire a time duration between a predetermined edge of the first comparison signal ST32 and a predetermined edge of the second comparison signal ST34 and to provide a time signal TS dependent on said time duration at an output.

Figure 7A:
FIGS. 7A–D illustrate exemplary profiles of selected signals illustrated in FIGS. 1 and 6.
Figure 7B:
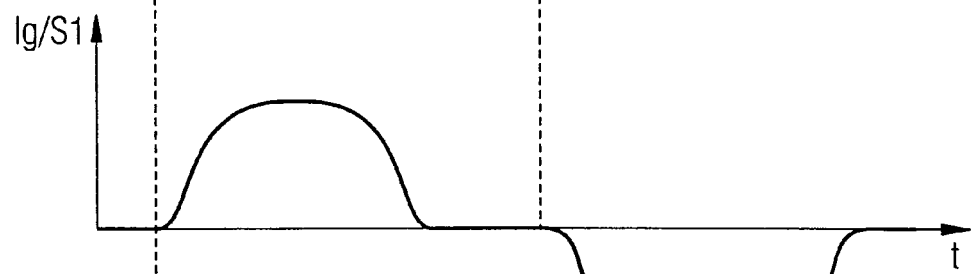
Figure 7C:
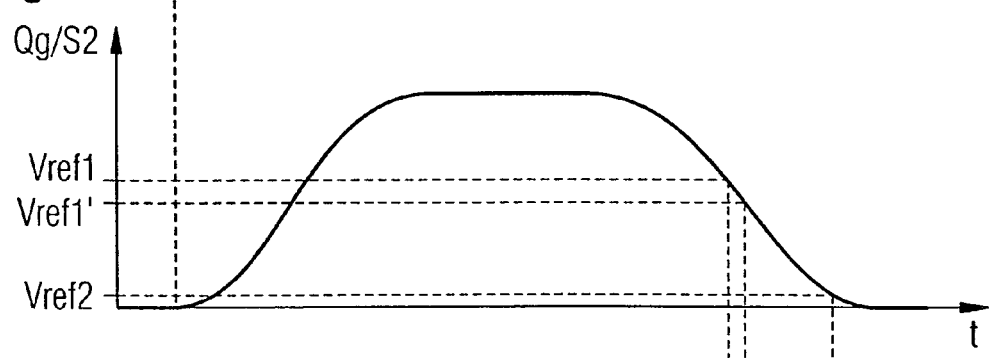
Figure 7D:
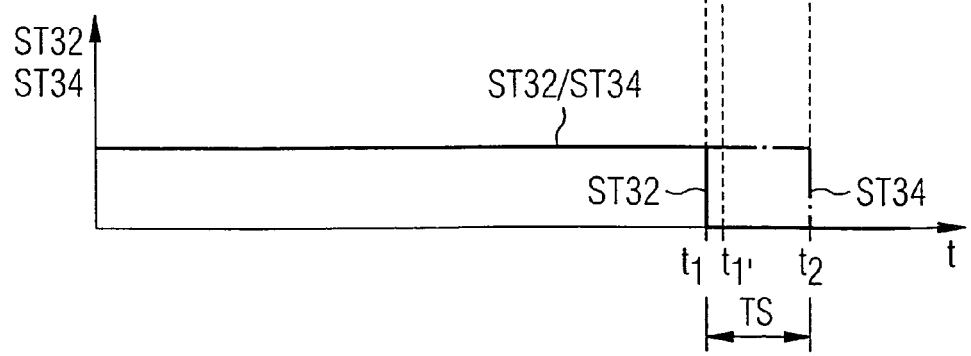

FIG. 7B illustrates the temporal profile of the charge signal S2 for the drive signal IN depicted in FIG. 7A and the charging current Ig illustrated in FIG. 7B. FIG. 7C furthermore depicts the levels of the first and second reference signals Vref1, Vref2. FIG. 7C shows the temporal profiles of the first and second comparison signals ST32, ST34 which result from the comparisons of the first and second reference signals Vref1, Vref2 with the charge signal S2.

The circuit arrangement illustrated in FIG. 6 is designed to detect the switch-off instant of the MOSFET and to provide a corresponding state signal ST. In the exemplary embodiment, the time acquisition unit 35 is designed to determine the temporal distance between the falling edge of the first comparison signal ST32 and the falling edge of the second comparison signal ST34 and to provide a time signal TS dependent on said temporal distance. In the example, the time signal TS corresponds to the temporal distance between instants t1 and t2, at which the falling edges of the comparison signals ST32 and ST34, respectively, are located.

The instant t1 corresponds to the instant at which a first quantity of charge, which is proportional to the first reference value Vref1, is still stored on the gate electrode during the switch-off operation. The instant t2 corresponds to a later instant at which a second quantity of charge is stored on the gate electrode, said second quantity of charge being proportional to the second reference signal Vref2 and being less than the first quantity of charge. Said second reference value Vref2, which is zero for example, is chosen such that the MOSFET reliably turns off if only the second quantity of charge is stored on the gate electrode G. Knowledge of the time duration TS between an instant at which the first quantity of charge is stored on the gate electrode G and an instant at which only the second quantity of charge is stored on the gate electrode G can be used during subsequent drive cycles for predicting the switch-off instant. Thus, it is possible, during subsequent drive cycles, on the basis of the first comparison signal ST32, to determine the instants at which in each case the first quantity of charge is still stored on the gate electrode, it then being possible to use the time signal to predict when the switch-off instant is reliably reached. If the MOSFET T is used in a circuit, for example, in the case of which, after the switch-off instant of the MOSFET has been reached, other components, for example further MOSFETs, are driven, and if, during the further processing of a state signal indicating the switch-off instant of the MOSFET into drive signals for the further components, gate transit times are present which bring about a delay between a level change in the state signal, said level change identifying the switch-off instant, and an actual driving of the other components, then it is possible, upon application of the method explained, to eliminate said gate transit times by virtue of the state signal which indicates the switch-off instant of the MOSFET already changing its level before the MOSFET turns off. The instant at which the state signal changes its level in order to indicate the switch-off state of the MOSFET is determined, for example, by subtracting the gate transit times from the time signal TS and by adding the time duration obtained thereby to the instant at which the first quantity of charge is still stored on the gate electrode of the MOSFET.

In order to provide the state signal ST depending on the time signal TS and the first comparison signal ST32, the evaluation unit 30 comprises a combination circuit 36, to which the first comparison signal ST32 and the time signal TS are fed. This combination circuit 36 preferably has a parameter input, to which a setting parameter P can be fed, which specifies how long there is to be waited after a falling edge of the first comparison signal 32 has been reached, until an edge of the state signal ST identifying the switch-off instant is to be generated. In this case, the parameter may determine a specific percentage of the time signal TS in order, for example, to wait for half the time between the falling edge of the first and second comparison signal ST32, ST34 until an edge of the state signal ST identifying the switch-off instant is generated. The parameter may also define a time value which is to be subtracted from the time signal TS, the edge of the state signal ST identifying the switch-off instant then being generated a predetermined time duration after the falling edge of the first comparison signal ST32, said predetermined time duration corresponding to the difference between the time signal TS and the time value prescribed by the parameter P.

In the case of the method explained with reference to FIG. 6, it is likewise necessary to wait for at least one switch-off cycle until a corresponding time signal TS is available. In order to correctly generate a state signal ST as early as during a first switch-off cycle, the second comparison signal ST34 is furthermore fed to the combination circuit 36 in FIG. 6, the combination circuit 36 being designed to generate the state signal ST on the basis of the first comparison signal ST32 and the time signal TS in the manner explained above if the time signal TS assumes a value not equal to zero. The time acquisition unit 35 is clocked by the drive signal IN and provides the time signal TS preferably in each case at the end of a switch-off cycle for the next switch-off cycle. A time signal is not yet available during a first drive cycle. The combination circuit 36 is therefore designed to output the second comparison signal ST34 as state signal ST if the time signal TS is zero during the first drive cycle.

A method in which a temporal distance between the presence of a first and second gate charge is determined, it being possible to use said temporal distance during subsequent drive cycles for providing the state signal, has been explained in FIGS. 6 and 7 on the basis of a circuit arrangement for determining the switch-off instant of the MOSFET. It goes without saying that a corresponding circuit arrangement can also be used for detecting the switch-on state if the reference signals Vref1, Vref2 are chosen suitably and a time acquisition unit is chosen which determines the temporal distance between rising edges of the first and second comparison signals ST32, ST34.

Figure 12A:
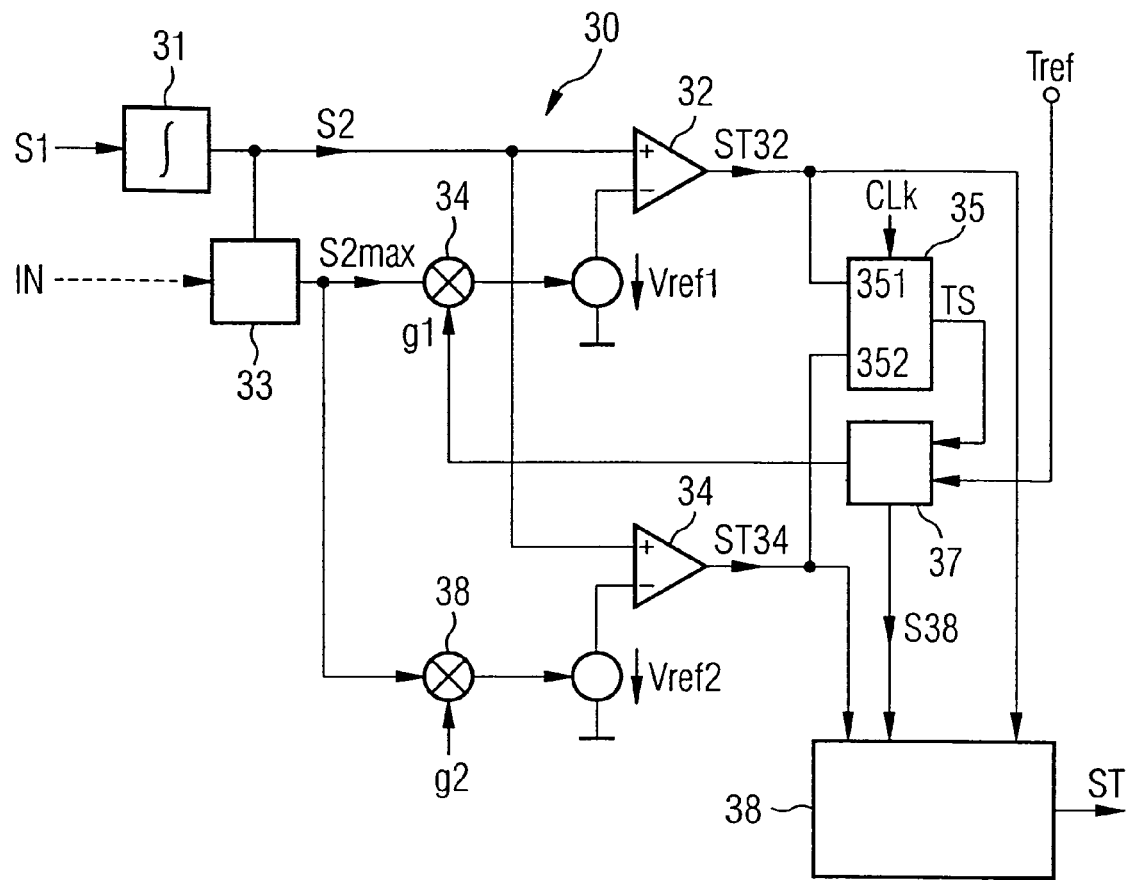
FIGS. 12A–12B illustrate modifications of the evaluation unit illustrated in FIG. 6.

FIG. 12A illustrates a modification of the circuit shown in FIG. 6, which carries out a modified method for providing a state signal ST indicating a switching state. The circuit arrangement in accordance with FIG. 12 is fed a reference time signal Tref, which is compared with the time signal TS of the time acquisition unit 35 in a time comparison unit 37. In the manner explained above, said time signal TS represents the temporal distance between a first instant t1, at which the charge signal S2 reaches the first reference value Vref1, and a second instant t2, at which the charge signal S2 reaches the second reference value Vref2. The comparison unit 37 serves for setting the first reference value Vref1, for which purpose the comparison unit 37 in FIG. 12 provides the first weighting factor g1.

Figure 12B:
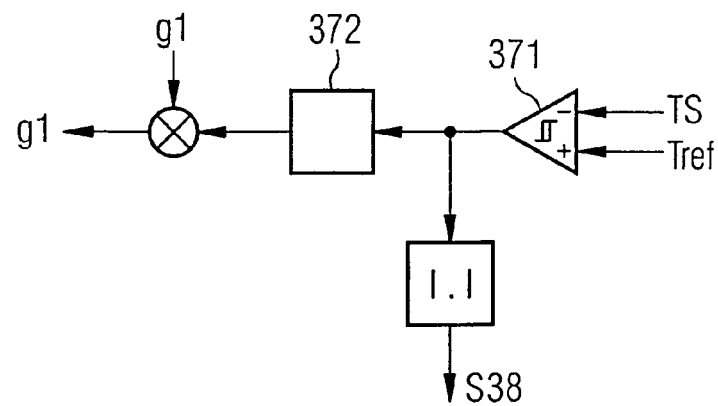

Referring to FIG. 12B, said comparison unit 37 comprises for example a comparator 371 with a switching hysteresis, to which the time signal TS and the reference signal Tref are fed and which can assume three different output values, −1, 0 +1, and downstream of which a counter 372 is connected, the counter reading of which is increased, is decreased or remains the same according to the comparator output signal. The counter output signal is weighted with a weighting factor g1 in order to provide the weighting factor g1. The method of operation of this circuit arrangement is explained below under the assumption that a state signal ST which serves for indicating the switch-off state is generated. If the time signal TS is greater than the reference signal Tref, and if the first instant t1 thus precedes the second instant t2 by a time duration which is greater than the reference time duration Tref, then the counter 372 is decremented by means of the comparator output signal in order to decrease the first reference value Vref1, as a result of which the first time duration TS and thus the first time signal TS decrease during a next switch-off cycle, as can be seen from FIGS. 7C and 7D, in FIG. 7C Vref1' illustrating a decreased first reference value and t1' illustrating the resultant temporal position of the first instant t1' during a next switch-off cycle. If the reference time duration Tref is greater than the first time duration TS, then the comparator 371 supplies a positive output signal (+1) in order to increment the counter 372 and thereby increase the first reference value Vref1. The counter reading remains unchanged if the difference between the first time signal TS and the reference signal Tref lies within an interval which is prescribed by the switching hysteresis of the comparator 371 and prescribes a threshold value for increasing or decreasing the first reference value Vref1.

The first reference time Tref is externally adjustable and corresponds for example to a delay time which elapses between a falling edge of the state signal ST and the driving of further circuit components (not specifically illustrated) which are intended to be driven depending on the presence of a falling edge of the state signal ST. These delay times are governed for example by gate transit times of evaluation circuits. If the reference time Tref is chosen in accordance with said delay times, then it is possible, when a first time duration TS approximately corresponding to the reference time Tref is established, to generate a falling edge of the state signal ST with a falling edge of the first comparison signal ST32. Owing to the delay time explained above, the further circuit components are in this case driven only after the delay time has elapsed, the gate charge then having fallen to a value which corresponds to the second reference value Vref2 and which is chosen such that the transistor T reliably turns off if this reference charge is reached.

The first comparison signal ST32, the second comparison signal ST34 and a time comparison signal S38 are fed to a combination circuit 38 for generating the state signal ST. The combination circuit 38 is designed for example as a multiplexer which outputs the first comparison signal ST32 or the second comparison signal ST34 as state signal ST according to the time comparison signal S38. The time comparison signal S38 corresponds for example to the magnitude of the comparator output signal, this magnitude value being formed by a unit 37 and being equal to 1 if the difference between the first time signal TS and the reference signal Tref is greater than the switching hysteresis of the comparator, that is to say if the first time signal TS and the reference signal Tref deviate significantly from one another. In this case, the state signal ST output is the second comparison signal ST34, which has a falling edge only when the charge signal S2 has fallen to the second reference value Vref2.

If the first time signal TS and the reference signal Tref deviate only slightly from one another, then a 0 is output as the time comparison signal S38 and the first comparison signal ST32 is output as state signal ST to the output of the combination circuit. It is assumed in this case that, between the instant at which the charge on the drive electrode corresponds to the first reference value Vref1 and the instant at which the charge corresponds to the second reference value Vref2 and at which the MOSFET T reliably turns off, a time duration elapses which corresponds to the reference time Tref, said reference time Tref being chosen in one embodiment such that further circuit components which are driven according to a predetermined edge of the state signal ST are driven, owing to circuit delay times, at the earliest after said reference time Tref1 has elapsed.

For the sake of completeness, it should be pointed out that, instead of the two comparators 32 and 34 in the exemplary embodiments explained above, it is also possible, in a manner that is not illustrated, to use one comparator, to which the first and second reference values Vref1, Vref2 are fed via a changeover switch, the changeover switch being changed over depending on the output signal of the comparator in order, for example when the charge signal reaches the first reference value Vref1, to feed the second reference signal Vref2 to the comparator for a further comparison.

Figure 8:
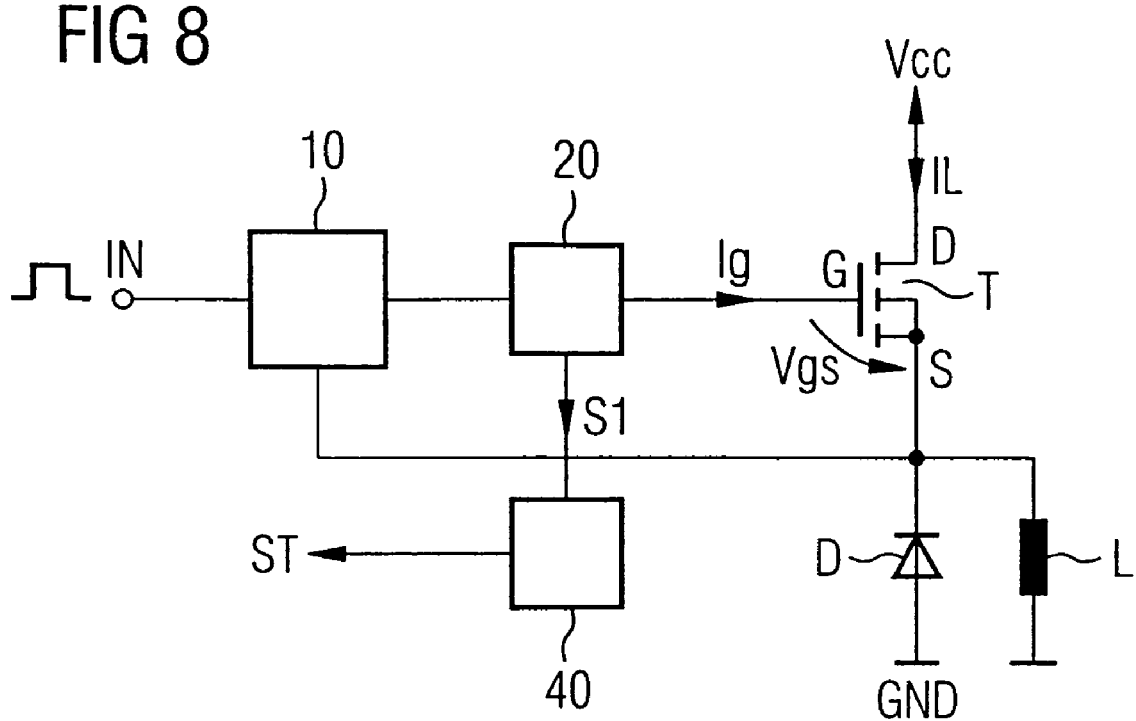
FIG. 8 illustrates a circuit arrangement with a MOSFET used as a high-side switch and with a drive circuit, the drive circuit having a circuit arrangement for acquiring the switching state of the MOSFET.

FIG. 8 illustrates a further circuit arrangement having a MOSFET T, which is driven according to a drive signal IN via a driver circuit 10. The MOSFET is connected as a high-side switch between a positive supply potential Vcc and an inductive load L having a freewheeling diode D. In order to determine the switching state of this MOSFET T, the current acquisition unit 20 already explained is provided, which provides a current measurement signal S1 dependent on the gate charging current Ig, which signal is fed to an evaluation unit 40, which provides the state signal ST dependent on the switching state of the MOSFET T.

Figure 10:
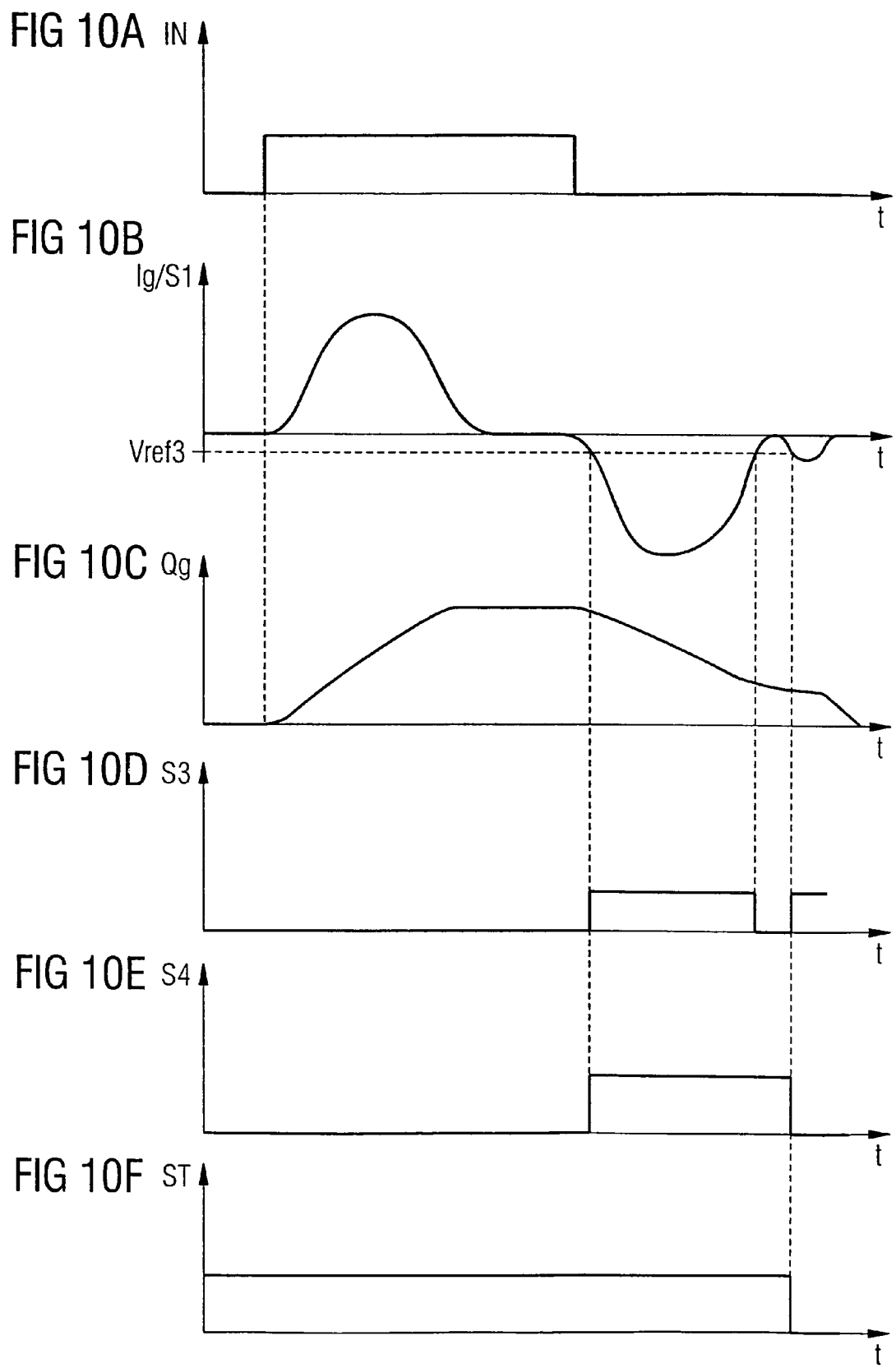
FIGS. 10A–10F illustrate exemplary profiles of selected signals illustrated in FIGS. 1 and 9.

FIGS. 10A–10C illustrates, in the order mentioned, an exemplary profile of the drive signal IN over time, and also the gate charging current Ig or the current measurement signal S1 and the gate charge Qg over time. The gate charging current Ig is provided by the driver circuit 10 for example in that a drive voltage is applied between the gate terminal G and the source terminal S of the MOSFET T for the purpose of on-state driving, while the gate terminal G and the source terminal S are short-circuited by means of the driver circuit 10 for the purpose of off-state driving of the MOSFET. A particular feature in the application of the MOSFET as a high-side switch for inductive loads is manifested in the gate charging current Ig during the switch-off operation in that said gate charging current Ig has two peaks, that is to say that the MOSFET is discharged in two phases. The arising of these two peaks is explained briefly below.

If the MOSFET is switched off, first of all a large part of the gate charge flows away, which leads to the first peak in the gate current profile. In this case, the internal gate-source voltage decreases to the so-called plateau voltage, which lies between 3.5 and 5.5 volts depending on the type of MOSFET and which can be gathered from the data sheet of the MOSFET respectively used. If the internal gate-source voltage reaches said plateau voltage the actual switch-off operation of the MOSFET begins, the channel of said MOSFET, controlled via the gate electrode G, being pinched off and the load path of the MOSFET acquiring high impedance.

From that point, the load current IL flowing through the MOSFET begins to decrease. The polarity of the voltage across the inductive load L changes instantly in order to counteract this decrease in the current flowing through the inductive load, thus resulting in a current flow via the freewheeling diode D. During this "commutation time", which may last about 10 to 50 ns, the gate-source voltage Vgs of the MOSFET remains approximately constant, that is to say, hardly any charge flows away from the gate G of the MOSFET T and the gate current Ig is almost zero. Only when the current through the inductive load L is taken over exclusively by the freewheeling diode D, that is to say, after the commutation time has elapsed, is the gate G of the MOSFET T completely discharged, thus resulting in the second peak in the profile of the gate charging current Tg. Parasitic inductances of the leads of a load connected to the MOSFET already suffice as "inductive loads" which bring about this effect of two-stage discharging.

Figure 9:
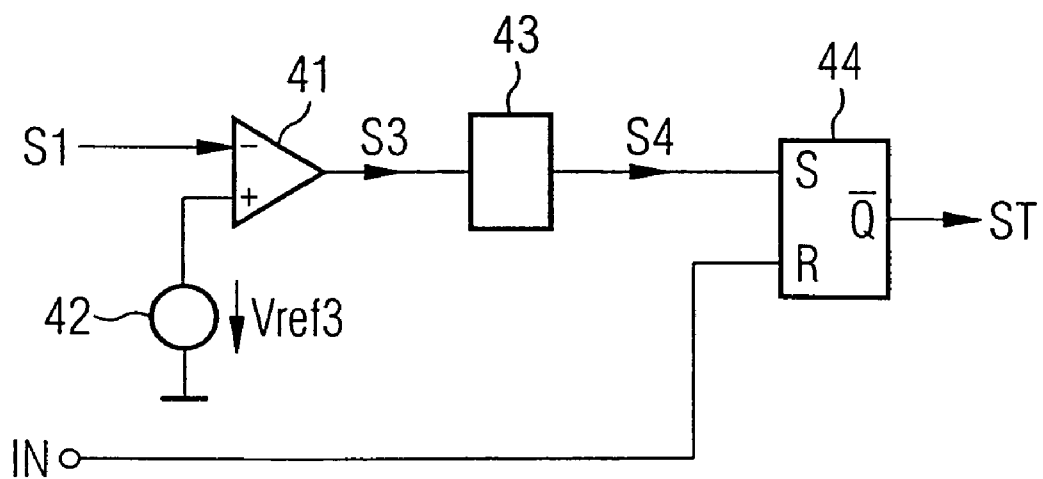
FIG. 9 illustrates a further exemplary embodiment of an evaluation unit for providing a state signal dependent on a switching state.

The exemplary embodiment of the evaluation unit 40 as illustrated in FIG. 9 makes use of this insight that the switch-off operation of a MOSFET employed as a high-side switch of an inductive load proceeds in two waves. The evaluation unit 40 comprises a comparator unit 41, to which the current measurement signal S1 and a reference signal Vref3 provided by a reference voltage source 42 are fed. A comparison signal S3 is available at the output of the comparator unit 41, and is fed to a counting unit 43, which provides a counting signal S4 dependent on a counter reading of the counter arrangement 43. Connected downstream of the counter arrangement 43 is an evaluation unit 44, which provides the state signal ST depending on the counter reading and thus depending on the counter output signal S4.

FIG. 10D illustrates the temporal profile of said comparison signal S3, which has a rising edge in each case when the current signal S3 falls below the value of the (negative) reference signal Vref3.

In the exemplary embodiment, the counter 43 is designed as a binary counter which can assume a first and a second counter reading and which changes its counter reading in each case with a rising edge of the comparison signal S3. With the first rising edge of the comparison signal S3, the counter output signal S4 illustrated in FIG. 10E assumes a high level corresponding to a counter reading of one, and, with the second rising edge of the comparison signal S3, said counter output signal assumes a low level corresponding to a counter reading of zero. The evaluation unit 44 connected downstream of the counter 43 is designed as a negative-edge-triggered RS flip-flop, the state signal ST being present at the inverting output thereof, said state signal likewise having a falling edge with the falling edge of the counter signal S4 at the set input. The flip-flop 44 is thus set with every second falling edge of the comparison signal S3. The flip-flop 44 is reset, depending on the drive signal IN, with the falling edge thereof, which initiates the switch-off operation.

The method according to the invention and the apparatus according to the invention, which have been elucidated on the basis of the preceding explanations, are in one embodiment employed in a half-bridge circuit having two power switches, the load paths of which are connected in series. FIG. 11 illustrates such a half-bridge circuit of a first and second MOSFET T1, T2, the drain-source paths of which are connected in series between a supply potential Vcc and a reference-ground potential GND. In the exemplary embodiment, the two MOSFETs T1, T2 are part of a buck converter having a low-pass filter comprising an LC element, which is connected to an output terminal OUT common to the load path terminals of the MOSFETs T1, T2 and to which is connected a load for supply with an output voltage Vout. The low-pass filter LC and the load R to be supplied form an inductive load of the half-bridge.

The MOSFETs T1, T2 are driven in clocked fashion by means of a driver circuit, it being necessary to ensure that the MOSFETs do not turn on together, and, in order to set the output voltage Vout, it being possible to vary the clock ratio of the drive cycles of the MOSFETs T1, T2 in a sufficiently known manner. For this purpose, a signal dependent on the output voltage Vout (illustrated in a dashed manner in FIG. 11) is fed to a drive circuit 11, which prescribes the drive cycles of the MOSFETs T1, T2.

For the driving of the MOSFET T1 serving as a high-side switch, provision is made of an inverter with a p-conducting MOSFET P1 and an n-conducting MOSFET N1, which, according to a first drive signal AS1 provided by the drive circuit 11, apply a drive voltage V1 between the gate terminal G and the source terminal S of the first MOSFET T1 in order to drive the MOSFET T1 in the on state, or short-circuit the gate terminal G and the source terminal S in order to turn the MOSFET T1 off. The drive voltage V1 is provided by a sufficiently known bootstrap circuit D1, C2, the drive voltage V1 approximately corresponding to the value of the supply potential Vcc.

The second MOSFET T2, serving as a low-side switch, is driven via an inverter in a corresponding manner according to a second drive signal AS2, provided by the drive circuit 11, the inverter having a p-conducting MOSFET P2 between supply potential Vcc and the gate terminal G of the second MOSFET T2 and an n-conducting MOSFET N2 between the gate terminal G of the second MOSFET T2 and reference-ground potential GND. The first and second drive signals AS1, AS2 are provided by the drive circuit 11 depending on the drive signal IN and depending on state signals ST1, ST2, the first state signal ST1 specifying the switching state of the first MOSFET T1 and the second state signal ST2 specifying the switching state of the second MOSFET T2.

A first evaluation unit 301 is provided in order to determine the first state signal ST1 and a second evaluation unit 302 is provided in order to determine the second state signal ST2. These evaluation units 301, 302 are respectively fed current measurement signals S11, S12, which are proportional to gate charging currents Ig1, Ig2, of the first and second MOSFETs T1, T2. Said current measurement signals S11, S12 in each case correspond to the voltage drop across the load path of the currently turned-on transistor P1, N1, P2, N2 of the inverters. In this case, in order to change over between the two transistors of an inverter, a switch SW1, SW2 is respectively connected upstream of each evaluation unit 301, 302, which switch is driven depending on the respective drive signal AS1, AS2 in order thus to apply the voltage across the load path of the transistor that is respectively currently being driven in the on state to the evaluation unit 301, 302.

The evaluation units 301, 302 are designed in accordance with the evaluation units explained with reference to the previous figures, the evaluation unit 301 for determining the switching state of the high-side switch being designed as an evaluation unit in accordance with FIG. 9.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for determining the switching state of a transistor having an insulated drive electrode comprising:
   charging the drive electrode during a switch-on cycle depending on a drive signal;
   discharging the drive electrode during a switch-off cycle depending on the drive signal;
   turning on or turning off the transistor depending on the charge stored on the drive electrode;
   evaluating the temporal profile of a charging and discharging current of the drive electrode or the temporal profile of the charge stored on the drive electrode in order to determine the switching state; and
   providing a state signal dependent on the switching state.

2. The method of claim 1, further comprising:
   providing a current measurement signal dependent on the charging and discharging current;
   integrating the current measurement signal over time in order to provide a charge signal; and
   comparing of the charge signal with a first reference signal and providing the state signal dependent on the switching state depending on the comparison result.

3. The method of claim 2, wherein during a switch-on cycle, a charging current flows onto the control electrode, a maximum value of the charge signal is determined, and wherein the first reference signal is set depending on the maximum value determined.

4. The method of claim 1, further comprising:
   during a drive cycle of the transistor, determining a first time duration between a first instant, at which a first quantity of charge is stored on the drive electrode and a second instant, at which a second quantity of charge is stored on the drive electrode;
   during a subsequent drive cycle of the transistors, determining a third instant, at which the first quantity of charge is stored on the drive electrode; and
   providing a state signal, which has a level change at a fourth instant, said fourth instant being dependent on the third instant and the first time duration.

5. The method of claim 4, wherein the first time duration is determined during a switch-off cycle of the transistor.

6. The method of claim 1, further comprising:
   during a drive cycle of the transistors, determining a first time duration between a first instant, at which a first quantity of charge is stored on the drive electrode and a second instant, at which a second quantity of charge is stored on the drive electrode; and
   comparing the first time duration with a reference time duration and alteration of the value of the first quantity of charge to be determined depending on the comparison result and generation of the state signal depending on the comparison result.

7. The method of claim 6, wherein a falling edge of the state signal is generated depending on the first instant if a deviation between the first time duration and the reference time duration is less than a predetermined threshold value.

8. The method of claim 6, wherein a falling edge of the state signal is generated depending on the second instant if a deviation between the first time duration and the reference time duration is greater than a predetermined threshold value.

9. The method of claim 1, further comprising:
   providing a current measurement signal dependent on a charging and discharging current;
   during a switch-off cycle, comparing the current measurement signal with a reference signal; and
   providing a state signal, which has a level change at an instant at which the magnitude of the current measurement signal exceeds the reference value for the n-th time during the switch-off cycle, where n is an integer greater than 1.

10. The method of claim 9, wherein n=2.

* * * * *